(12) United States Patent
Chen et al.

(10) Patent No.: US 12,713,967 B2
(45) Date of Patent: Aug. 18, 2026

(54) 3D FAN-OUT PACKAGING STRUCTURE OF INTERCONNECTION SYSTEM WITH ULTRA-HIGH DENSITY AND METHOD FOR MANUFACTURING THE SAME

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor(Jiangyin) Corporation, JiangSu (CN)

( * ) Notice: Subject to any disclaimer, the term of this patent is extended or adjusted under 35 U.S.C. 154(b) by 531 days.

(21) Appl. No.: 18/142,416

(22) Filed: May 2, 2023

(65) Prior Publication Data

US 2023/0386950 A1 Nov. 30, 2023

(30) Foreign Application Priority Data

May 30, 2022 (CN) ......................... 202210604145.7

(51) Int. Cl.
*H10W 74/10* (2026.01)
*H10W 70/60* (2026.01)
(Continued)

(52) U.S. Cl.
CPC ........ *H10W 74/117* (2026.01); *H10W 72/019* (2026.01); *H10W 72/20* (2026.01);
(Continued)

(58) Field of Classification Search
CPC ............... H01L 24/02–03; H01L 24/11; H01L 2224/03; H01L 2224/111; H01L 24/09; H01L 2224/06505; H01L 2224/14104; H01L 21/56; H01L 2224/02379; H01L 2224/02373; H10W 70/614; H10W 90/22;
(Continued)

(56) References Cited

U.S. PATENT DOCUMENTS

2013/0277829 A1* 10/2013 Yee .................. H01L 23/49811 257/737
2015/0270232 A1* 9/2015 Chen .................... H01L 21/568 257/691
(Continued)

*Primary Examiner* — Didarul A Mazumder
(74) *Attorney, Agent, or Firm* — IPRTOP LLC

(57) ABSTRACT

A 3D fan-out packaging structure of an interconnection system with ultra-high density and a method for manufacturing the same are disclosed; the packaging structure includes a first insulating layer, first metal solder pads, a metal pillar, a first chip, a second insulating layer, second metal solder pads, a first encapsulating layer, a first rewiring layer, a second chip, a second encapsulating layer, a second rewiring layer, and a solder ball. The packaging structure adopts the "RDL first" process, and non-soldering interfaces between the first and second metal solder pads help achieve bonding with a spacing of 5-10 μm or even less, much smaller than conventional soldering spacings, thus increasing the number of available I/O ports and obtaining a high-density, highly integrated packaging structure. In addition, in the present disclosure, various chips and electronic components can be integrated together, thereby achieving high-performance system-level packaging with higher flexibility and compatibility.

9 Claims, 3 Drawing Sheets

(51) Int. Cl.
*H10W 70/652* (2026.01)
*H10W 70/655* (2026.01)
*H10W 72/00* (2026.01)
*H10W 72/20* (2026.01)
*H10W 72/90* (2026.01)
*H10W 74/01* (2026.01)
*H10W 74/47* (2026.01)

(52) U.S. Cl.
CPC ........... *H10W 72/90* (2026.01); *H10W 74/01* (2026.01); *H10W 74/47* (2026.01); *H10W 70/60* (2026.01); *H10W 70/652* (2026.01); *H10W 70/655* (2026.01); *H10W 72/01208* (2026.01); *H10W 72/244* (2026.01); *H10W 72/247* (2026.01); *H10W 72/248* (2026.01); *H10W 72/957* (2026.01)

(58) Field of Classification Search
CPC ......................... H10W 70/635; H10W 90/724; H10W 72/244
USPC .................................. 257/678; 438/106, 121
See application file for complete search history.

(56) References Cited

U.S. PATENT DOCUMENTS

2019/0288370 A1* 9/2019 Chen ....................... H01L 23/66
2022/0084925 A1* 3/2022 Chen ....................... H01L 24/73
2022/0165633 A1* 5/2022 Kuo ........................ H01L 24/16

* cited by examiner

3D FAN-OUT PACKAGING STRUCTURE OF INTERCONNECTION SYSTEM WITH ULTRA-HIGH DENSITY AND METHOD FOR MANUFACTURING THE SAME

CROSS REFERENCE TO RELATED APPLICATION

The present application claims the benefit of priority to Chinese Patent Application No. CN 202210604145.7, entitled "3D FAN-OUT PACKAGING STRUCTURE OF INTERCONNECTION SYSTEM WITH ULTRA-HIGH DENSITY AND METHOD FOR MANUFACTURING SAME", filed with CNIPA on May 30, 2022, the disclosure of which is incorporated herein by reference in its entirety for all purposes.

FIELD OF TECHNOLOGY

The present disclosure generally relates to semiconductor packaging technology, and in particular, relates to a 3D fan-out packaging structure of an interconnection system with ultra-high density and a method for manufacturing the same.

BACKGROUND

Traditional substrates such as printed circuit boards are used to support electronic components, and are carriers for electrical connections between electronic components. When substrates are combined in batches, up to 12 layers of substrates can be assembled together, and if more chip I/O ports are needed, more substrates are required, which increases the manufacturing cost. Traditional substrates are also limited in terms of process precision; specifically, the line width or line spacing of a conventional substrate is at least 20 μm, and often becomes larger than 50 μm. As the commercial chip integration level is getting higher, current substrate technology will find it harder to follow suit. This means more advanced packaging technology is needed in order to integrate different high-density chips together to form a more powerful and power-efficient system, which has become a major challenge in the field of advanced chip packaging.

Meanwhile fan-out wafer-level packaging (FOWLP) has become one of the more advanced fan-out packaging methods due to the fact that it supports more input/output (I/O) ports and provides better integration flexibility. The redistribution layer (RDL)-first structure commonly used in fan-out wafer-level packaging is obtained by fixing bumps on a chip to bumps on a metal wiring layer by one-on-one soldering. However, such fixing requires the spacing between two adjacent bumps to be greater than 15 μm, or even 20 μm; otherwise, solder bridges between the two bumps will form, causing electrical connection errors for the chip.

SUMMARY

The present disclosure provides a method for manufacturing a 3D fan-out packaging structure of an interconnection system with ultra-high density, comprising: 1) forming a first insulating layer over a support substrate, and disposing first metal solder pads in the first insulating layer; 2) forming one or more metal pillars, wherein each of the one or more metal pillars is arranged to attach to one of the first metal solder pads; 3) providing a first chip; bonding a second insulating layer to the first insulating layer through hybrid bonding; forming second metal solder pads in the second insulating layer; aligning and connecting each of the first metal solder pads not attached to the one or more metal pillars with one of the second metal solder pads through hybrid bonding; and attaching a first surface of the first chip to the second insulating layer and the second metal solder pads; 4) disposing a first encapsulating layer on the first chip and the one or more metal pillars, and planarizing the first encapsulating layer to expose a second surface of the first chip and top surfaces of the one or more metal pillars, wherein the first surface and the second surface of the first chip are opposite to each other; 5) forming a first rewiring layer over the first encapsulating layer, wherein the first rewiring layer comprises a first dielectric layer, and a first wiring metal layer disposed in the first dielectric layer and electrically connected to the one or more metal pillars; 6) removing the support substrate to expose the first insulating layer and the first metal solder pads, forming a second rewiring layer on an exposed surface of the first insulating layer, wherein the second rewiring layer comprises a second dielectric layer, and a second metal layer disposed in the second dielectric layer and electrically connected to the one or more metal pillars, and forming solder balls on a surface of the second wiring metal layer; and 7) mounting a second chip to the first rewiring layer and forming a second encapsulating layer on a top and side surfaces of the second chip.

The present disclosure further provides a 3D fan-out packaging structure of an interconnection system with ultra-high density, comprising: a first insulating layer, and first metal solder pads, wherein the first metal solder pads are disposed in the first insulating layer; one or more metal pillars, each connected to one of the first metal solder pads; a second insulating layer and second metal solder pads, wherein the second metal solder pads are disposed in the second insulating layer, wherein the first metal solder pads not connected with the one or more metal pillars are aligned and bonded with the second metal solder pads in a one-to-one correspondence, and wherein the first insulating layer and the second insulating layer are bonded; a first chip, wherein a first surface of the first chip is attached to the second metal solder pads and the second insulating layer; a first encapsulating layer, wherein the first encapsulating layer is disposed on the first chip and the one or more metal pillars and wherein the first encapsulating layer is configured to expose a second surface of the first chip and top surfaces of the one or more metal pillars, wherein the first surface and the second surface of the first chip are opposite to each other; a first rewiring layer, formed over the first encapsulating layer, wherein the first rewiring layer comprises a first dielectric layer, and a first wiring metal layer disposed in the first dielectric layer and electrically connected to the metal pillar; a second chip, mounted to the first rewiring layer; a second encapsulating layer, disposed on the second chip; a second rewiring layer, disposed on a surface of the first insulating layer facing away from the first chip, wherein the second rewiring layer comprises a second dielectric layer, and a second wiring metal layer disposed in the second dielectric layer and electrically connected to the first metal solder pads; and solder balls formed on the second wiring metal layer.

In summary, the 3D fan-out packaging structure of an interconnection system with ultra-high density and the method for manufacturing the same of the present disclosure have the following beneficial effects: the 3D fan-out packaging structure adopts the "RDL first" process, and interfaces between the first metal solder pads and the second metal solder pads are non-soldering interfaces, which helps achieve bonding with a spacing of 5- or 10 μm or even less, much smaller than traditional soldering spacings (e.g., 20 μm), thus increasing the number of potential I/O ports and obtaining a high-density, highly integrated packaging structure. In addition, in the present disclosure, various chips and electronic components such as millimeter wave antennas, capacitors, inductors, electric crystals, graphics processing units, power management units, double-data-rate memories, flash memories, and filters, can be integrated together, thereby achieving high-performance system-level packaging with higher flexibility and compatibility.

BRIEF DESCRIPTION OF DRAWINGS

FIG. 9 is also a schematic diagram of a 3D fan-out packaging structure of an interconnection system with ultra-high density according to one embodiment of the present disclosure.

REFERENCE NUMERALS

Figure 1:
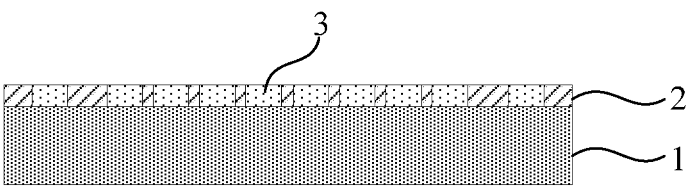
FIGS. 1 to 9 are schematic diagrams of intermediate structures obtained after major operations of a method for manufacturing a 3D fan-out packaging structure of an interconnection system which has ultra-high density.

1 Support substrate
2 First insulating layer
3 First metal solder pads
4 Metal pillars
5 First chip
6 Second insulating layer
7 Second metal solder pads
8 First encapsulating layer
9 First rewiring layer
91 First dielectric layer
92 First wiring metal layer
10 Second rewiring layer
101 Second dielectric layer
102 Second wiring metal layer
11 Solder balls
12 Second chip
13 Second encapsulating layer

DETAILED DESCRIPTION

The present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-9. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

As shown in FIGS. 1 to 9, the present disclosure provides quantity, a method for manufacturing a 3D fan-out packaging structure of an interconnection system with ultra-high density, and the method includes steps described below.

As shown in FIG. 1, the method includes providing a support substrate 1, and forming a first insulating layer 2 and first metal solder pads 3 on the support substrate 1, wherein the first metal solder pads 3 are disposed in the first insulating layer 2.

As an example, the support substrate 1 includes one of a glass substrate, a metal substrate, a semiconductor substrate, a polymer substrate, and a ceramic substrate. More specifically, in one example, the support substrate 1 is a silicon wafer. The shape of the support substrate 1 may be round, square or other desired shapes. In one example, the support substrate 1 is used to prevent the chips from cracking, warping, breaking, etc. during subsequent manufacturing processes.

Further, a release layer (not shown) is formed between the support substrate 1 and the first insulating layer 2, and the release layer is used to subsequently separate the support substrate 1 from the rest of the packaging structure. The release layer includes one of a tape layer and a polymer layer, which is applied to the support substrate 1 by spin coating and then cured by laser curing, ultra-violet (UV) curing, or thermal curing.

In an example, the spacing of the first metal solder pads 3 is less than 10 μm. In a further example, the spacing of the first metal solder pads 3 is less than 5 μm. In a further example, the spacing of the first metal solder pads 3 is 3 μm. In a further example, the spacing of the first metal solder pads 3 is 4 μm.

As an example, the first metal solder pads 3 include copper solder pads. top surfaces of the first metal solder pads 3 and the first insulating layer 2 facing away from the support substrate 1 are flush, which facilitates the subsequent hybrid bonding processes.

Figure 2:
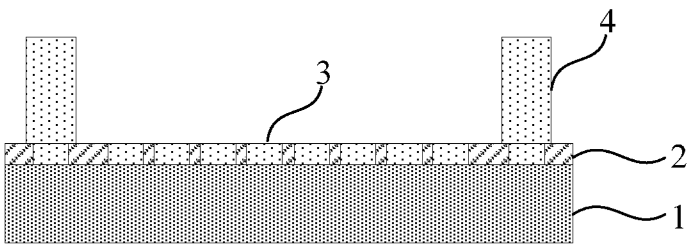

As shown in FIG. 2, one or more metal pillars 4 are formed on one or more of the first metal solder pads 3.

Specifically, in one example as shown in the figures, two metal pillars 4 are formed on two of the first metal solder pads 3, respectively, wherein the two first metal solder pads are the outermost ones among the first metal solder pads 3.

As an example, the metal pillars 4 include one or more of a copper pillar and a titanium pillar, and the method for forming the metal pillars 4 include one of physical vapor deposition (PVD), chemical vapor deposition (CVD), sputtering, electroplating, and chemical plating. In one example, a PVD process is used to form a copper layer, dispose photoresist on the copper layer, pattern the photoresist, perform etching of the copper layer, form the metal pillars on the outermost ones of the first metal solder pads 3, and remove the photoresist.

Figure 3:
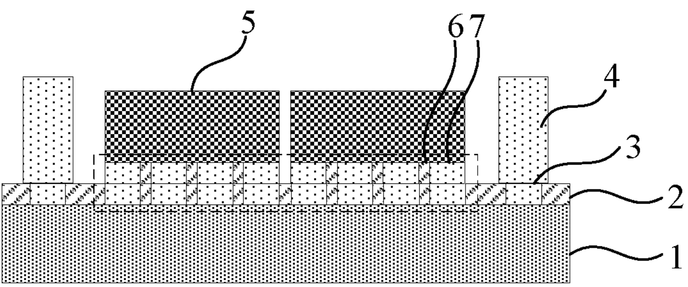

As shown in FIG. 3, a first chip 5 is provided, a second insulating layer 6 is formed on a first surface of the first chip 5, and second metal solder pads 7 are disposed in the second insulating layer 6; the first metal solder pads 3 which are not the outermost ones connecting to the two metal pillars 4 and the second metal solder pads 7 are bonded through hybrid bonding, and the first insulating layer 2 which is not under to the two metal pillars 4 and the second insulating layer 6 are bonded through hybrid bonding, so among the first metal solder pads 3, which is not connected to the metal pillars 4 is bonded to and vertically aligned with one of the second metal solder pads 7.

Specifically, as shown in FIG. 3, the dotted line circles out those first metal solder pads 3 not connecting to the two metal pillars 4 and the second metal solder pads 7 that are bonded together and aligned vertically to each other.

As an example, the first chip 5 connecting to the second metal solder pads 7 may be multiple chips and can be a master chip, such as a radio frequency (RF) chip, etc.

As an example, the spacing between two neighboring second metal solder pads 7 is less than 10 μm. As a preferred example, the spacing between two neighboring second metal solder pads 7 is less than 5 μm. As another preferred example, the spacing between two neighboring second metal solder pads 7 is 3 μm. As another preferred example, the spacing between two neighboring second metal solder pads 7 is 4 μm.

As an example, the second metal solder pads 7 include copper solder pads.

As shown in FIG. 3, the dotted line circles out those first metal solder pads 3 not connecting to the two metal pillars 4 and the second metal solder pads 7 that are bonded together through hybrid bonding and aligned vertically; similarly, the first insulating layer 2 which is not under to the two metal pillars 4 and the second insulating layer 6 are bonded through hybrid bonding and aligned vertically. Hybrid bonding is a bonding method applied when the corresponding wafer bonding interfaces include both metal and insulating materials, by which silicon wafers can be connected by atomic bonding without adhesive medium, thereby greatly improving chip performance, saving area, reducing costs, and achieving fine-pitch interconnection between metal pads, to avoid solder bridges between adjacent metal pads and improve the integration density.

Figure 4:
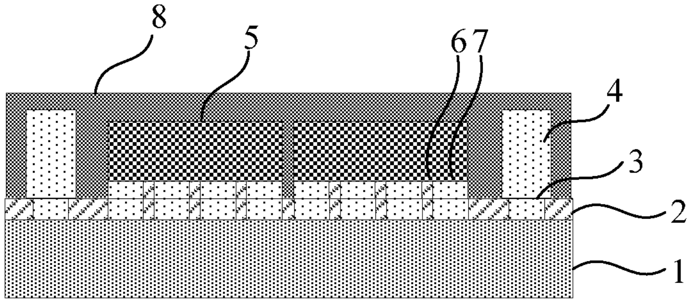
Figure 5:
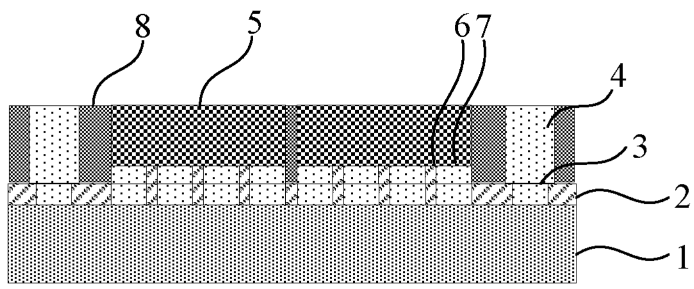

As shown in FIGS. 4 and 5, a first encapsulating layer 8 is then formed; the first encapsulating layer 8 is disposed first over the first chip 5 and the metal pillars 4 in FIG. 4 and then the encapsulating layer 8 is planarized to expose a second surface of the first chip 5 and top surfaces of the metal pillars 4 in FIG. 5, wherein the first surface and the second surface of the first chip 5 are opposite to each other.

As an example, the material of the first encapsulating layer 8 includes one or more of epoxy-based resin, liquid thermosetting epoxy resin, plastic molding compounds, and a method for forming the first encapsulating layer 8 includes one of the techniques of compression molding, transfer molding, liquid seal potting molding, vacuum lamination, and spin coating. An initially formed first encapsulating layer 8 is shown in FIG. 4. After a planarization process, including but not limited to grinding, performed on the initially formed first encapsulating layer 8, the second surface of the first chip 5 and the top surface of the metal pillars 4 are exposed, and are flush with the first encapsulating layer 8, as shown in FIG. 5.

Figure 6:
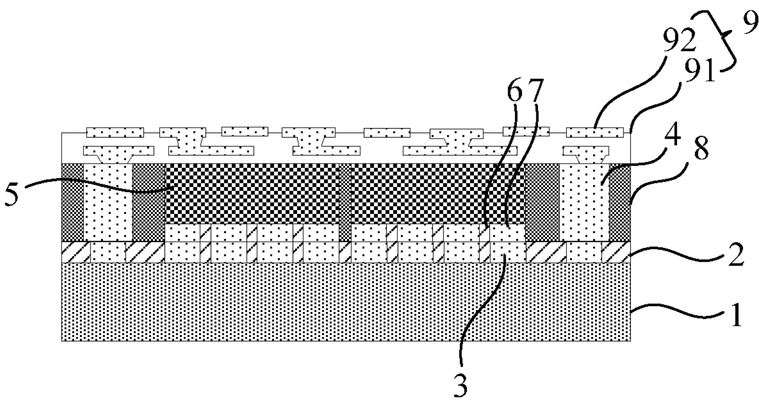

As shown in FIG. 6, a first rewiring layer 9 is formed on the first encapsulating layer 8, and the first rewiring layer 9 includes a first dielectric layer 91 and a first wiring metal layer 92, the first wiring metal layer 92 is disposed in the first dielectric layer 91 and electrically connected to the metal pillars 4.

As an example, a material of the first dielectric layer 91 includes at least one of epoxy resin, silicone, polyimide, polybenzoxazole, benzocyclobutene, silicon oxide, phosphor silica glass, fluorine containing glass, and other suitable materials.

As an example, a material of the first wiring metal layer 92 includes one of copper, aluminum, and titanium, a method for forming the first wiring metal layer 92 includes one of physical vapor deposition, chemical vapor deposition, sputtering, electroplating, and chemical plating, and the first wiring metal layer 92 is a single-layer structure or a multi-layer structure.

Figure 7:
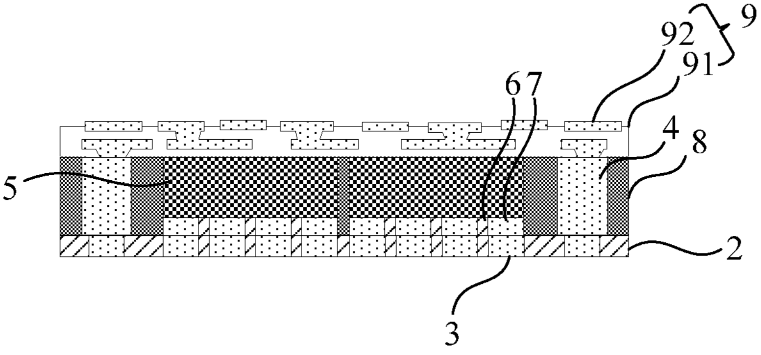
Figure 8:
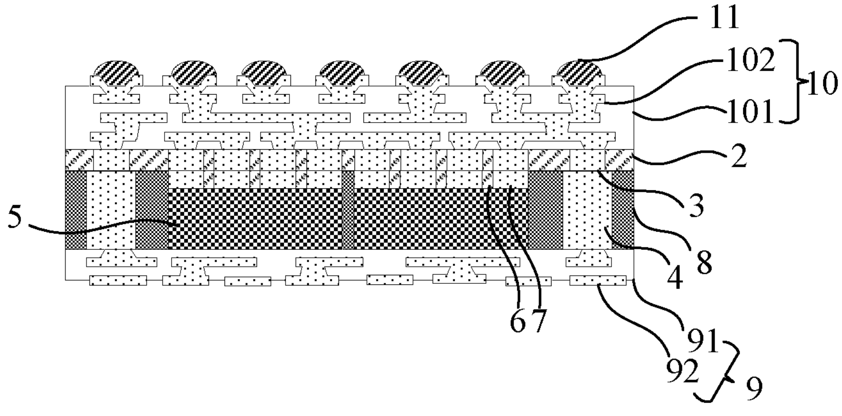

As shown in FIG. 7, the support substrate 1 is then removed to expose the first insulating layer 2 and the first metal solder pads 3; a second rewiring layer 10 is formed on an exposed surface of the first insulating layer 2 as shown in FIG. 8; the second rewiring layer 10 includes a second dielectric layer 101, and a second wiring metal layer 102 disposed in the second dielectric layer 101 and electrically connected to the first metal solder pads 3; solder balls 11 are then formed on a surface of the second wiring metal layer 102 facing away from the chips.

As an example, the step of removing the support substrate 1 includes exposing or heating the release layer (not shown in the figures).

It is to be noted that after removal of the support substrate 1, the obtained intermediate structure is inverted so that the exposed surfaces of the first insulating layer 2 and the first metal solder pads 3 are facing upwards (meaning the first chip 5 is below the first insulating layer 2), to facilitate subsequent processes.

As an example, a material of the second dielectric layer 101 includes at least one of epoxy resin, silicone, polyimide, polybenzoxazole, benzocyclobutene, silicon oxide, phosphor silica glass, fluorine containing glass, and other suitable materials.

As an example, a material of the second wiring metal layer 102 includes one of copper, aluminum, and titanium, a method for forming the second wiring metal layer 102 includes one of physical vapor deposition, chemical vapor deposition, sputtering, electroplating, and chemical plating, and the second wiring metal layer 102 is a single-layer structure or a multi-layer structure.

A material of the solder balls 11 includes, but is not limited to, copper or nickel. The second wiring metal layer 102 may have only solder balls 11 formed on its surface, or the second wiring metal layer 102 may have solder balls on metal pillars (not shown) formed on its surface.

Figure 9:
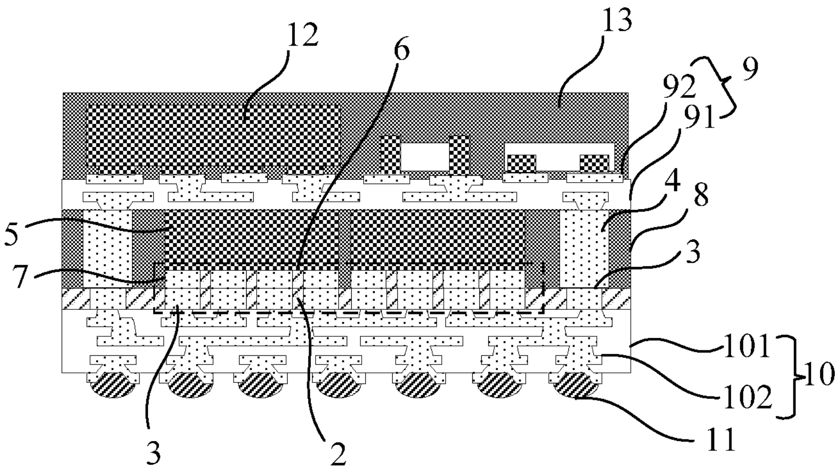

A second chip 12 is mounted to the first rewiring layer 9, and a second encapsulating layer 13 is formed over the top surface and side surfaces of the second chip 12, as shown in FIG. 9.

It is to be noted that before mounting the second chip 12, the structure obtained in the previous step may be flipped first so that the first rewiring layer 9 faces upwards (meaning the first chip 5 is below the first rewiring layer 9 after the flip), to facilitate the mounting of the second chip 12.

As an example, the second chip 12 may be one of a millimeter wave antenna, capacitor, inductors, electric crystals, graphics processing unit, power management unit, double-data-rate memory, flash memory, and filter. In addition, the second chip 12 may also include passive components such as capacitors, resistors, and inductors.

As an example, the second encapsulating layer 13 includes one or more of epoxy-based resin, liquid thermosetting epoxy resin, plastic molding compounds, and a method for forming the second encapsulating layer 13 includes one of compression molding, transfer molding, liquid seal potting molding, vacuum lamination, and spin coating.

The present disclosure further provides a 3D fan-out packaging structure of an interconnection system with ultra-high density, which may be obtained by the method described above.

As shown in FIG. 9, the packaging structure includes:

a first insulating layer 2 and first metal solder pads 3, wherein the first metal solder pads 3 are disposed in the first insulating layer 2;

metal pillars 4, formed on one or more of the first metal solder pads 3;

a first chip 5;

a second insulating layer 6, formed on a first surface of the first chip 5, and second metal solder pads 7, disposed in the second insulating layer 6, wherein the first metal solder pads 3 not connecting to the metal pillars 4 and the second metal solder pads 7 are bonded through hybrid bonding, and the first insulating layer 2 which is not under to the metal pillars 4 and the second insulating layer 6 are bonded through hybrid bonding, wherein among the first metal solder pads 3, each of those not connected to the metal pillars 4 is bonded to and vertically aligned with one of the second metal solder pads 7;

a first encapsulating layer 8, which is first disposed on the first chip 5 and the metal pillars 4 and later is planarized to expose the second surface of the first chip 5 and the top surfaces of the metal pillars 4, wherein the first surface and the second surface of the first chip 5 are opposite to each other;

a first rewiring layer 9, formed on the first encapsulating layer 8, wherein the first rewiring layer 9 includes a first dielectric layer 91, and a first wiring metal layer 92 disposed in the first dielectric layer 91 and electrically connected to the metal pillars 4;

a second chip 12, mounted to the first rewiring layer 9;

a second encapsulating layer 13, disposed on the top and side surfaces of the second chip 12;

a second rewiring layer 10, disposed on a surface of the first insulating layer 2 facing away from the first chip 5, wherein the second rewiring layer 10 includes a second dielectric layer 101 and a second wiring metal layer 102 disposed in the second dielectric layer 101 and electrically connected to the first metal solder pads 3; and solder balls 11, formed on the second wiring metal layer 102.

As an example, the spacing of the first metal solder pads 3 is less than 10 μm and the spacing of the second metal solder pads 7 is less than 10 μm.

As another example, the spacing of the first metal solder pads 3 is less than 5 μm, and the spacing of the second metal solder pads 7 is less than 5 μm.

In summary, the present disclosure provides a 3D fan-out packaging structure of an interconnection system with ultra-high density and a method for manufacturing the same, the 3D fan-out packaging structure adopts the "RDL first" process, and interfaces between the first metal solder pads and the second metal solder pads are non-soldering interfaces, which helps achieve smaller bonding dimensions with a spacing of 5-10 μm or even less, much smaller than the conventional soldering spacings (e.g., 20 μm), thus increasing the number of potential I/O ports and obtaining a high-density, highly integrated packaging structure. In addition, in the present disclosure, various electronic chips and components such as millimeter wave antennas, capacitors, inductors, electric crystals, graphics processing units, power management units, double-data-rate memories, flash memories, and filters, can be integrated together, thereby achieving high-performance system-level packaging with higher flexibility and compatibility.

Therefore, the present disclosure effectively overcomes various shortcomings in the existing technology and has high industrial utilization value.

The above-mentioned embodiments are for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for manufacturing a 3D fan-out packaging structure of an interconnection system with ultra-high density, comprising:

1) Forming a first insulating layer over a support substrate, and disposing first metal solder pads in the first insulating layer, wherein the first metal solder pads comprise a first type of the first metal solder pads and a second type of the first metal solder pads;

2) Forming one or more metal pillars, wherein each of the one or more metal pillars is arranged to align and attach to one of the first type of the first metal solder pads;

3) Providing a first chip;

bonding a second insulating layer to the first insulating layer through non-soldering hybrid bonding;

forming second metal solder pads in the second insulating layer;

aligning and connecting each of the second type of the first metal solder pads with one of the second metal solder pads in a one-to-one correspondence through the hybrid bonding; and attaching a first surface of the first chip to the second insulating layer and the second metal solder pads;

4) Disposing a first encapsulating layer on the first chip and the one or more metal pillars, and planarizing the first encapsulating layer to expose a second surface of the first chip and top surfaces of the one or more metal pillars, wherein the first surface and the second surface of the first chip are opposite to each other;

5) Forming a first rewiring layer over the first encapsulating layer, wherein the first rewiring layer comprises a first dielectric layer, and a first wiring metal layer disposed in the first dielectric layer and electrically connected to the one or more metal pillars;

6) Removing the support substrate to expose the first insulating layer and the first metal solder pads, forming a second rewiring layer on an exposed surface of the first insulating layer, wherein the second rewiring layer comprises a second dielectric layer, and a second metal layer disposed in the second dielectric layer and electrically connected to the one or more metal pillars, and forming solder balls on a surface of the second wiring metal layer; and 7) Mounting a second chip to the first rewiring layer and forming a second encapsulating layer on a top and side surfaces of the second chip.

2. The method for manufacturing the 3D fan-out packaging structure of the interconnection system with ultra-high density according to claim 1, wherein the support substrate comprises one of a glass substrate, a metal substrate, a semiconductor substrate, a polymer substrate, and a ceramic substrate.

3. The method for manufacturing the 3D fan-out packaging structure of the interconnection system with ultra-high density according to claim 1, wherein a release layer is formed between the support substrate and the first insulating layer, and the release layer comprises one of a tape layer and a polymer layer, wherein the release layer is formed by spin coating on the support substrate, and then curing by laser curing, UV curing, or thermal curing.

4. The method for manufacturing the 3D fan-out packaging structure of the interconnection system with ultra-high density according to claim 1, wherein a spacing between two adjacent second type of the first metal solder pads is less than 10 μm and a spacing between two adjacent second metal solder pads is less than 10 μm.

5. The method for manufacturing the 3D fan-out packaging structure of the interconnection system with ultra-high density according to claim 1, wherein a spacing between two adjacent second type of the first metal solder pads is less than 5 μm and a spacing between two adjacent second metal solder pads is less than 5 μm.

6. The method for manufacturing the 3D fan-out packaging structure of the interconnection system with ultra-high density according to claim 1, wherein the one or more metal pillars comprise one or more of a copper pillar and a titanium pillar, and a technique for forming the one or more metal pillars comprises one of physical vapor deposition, chemical vapor deposition, sputtering, electroplating, and chemical plating.

7. The method for manufacturing the 3D fan-out packaging structure of the interconnection system with ultra-high density according to claim 1, wherein each of the first metal solder pads and the second metal solder pads comprises copper solder pads.

8. The method for manufacturing the 3D fan-out packaging structure of the interconnection system with ultra-high density according to claim 1, wherein a material of the first encapsulating layer comprises one or more of epoxy-based resin, liquid thermosetting epoxy resin, plastic molding compounds, and a technique for forming the first encapsulating layer comprises one of compression molding, transfer molding, liquid seal potting molding, vacuum lamination, and spin coating; wherein a material of the second encapsulating layer comprises one or more of epoxy-based resin, liquid thermosetting epoxy resin, and plastic molding compounds, and a technique for forming the second encapsulating layer comprises one of compression molding, transfer molding, liquid seal potting molding, vacuum lamination, and spin coating.

9. The method for manufacturing the 3D fan-out packaging structure of the interconnection system with ultra-high density according to claim 1, wherein a material of the first wiring metal layer comprises one of copper, aluminum, and titanium, a technique for forming the first wiring metal layer comprises one of physical vapor deposition, chemical vapor deposition, sputtering, electroplating, and chemical plating, and wherein the first wiring metal layer is a single-layer structure or a multi-layer structure, Wherein a material of the second wiring metal layer comprises one of copper, aluminum, and titanium, wherein a technique for forming the second wiring metal layer comprises one of physical vapor deposition, chemical vapor deposition, sputtering, electroplating, and chemical plating, and wherein the second wiring metal layer is a single-layer structure or a multi-layer structure.

* * * * *